United States Patent
Coss, Jr. et al.

(10) Patent No.: US 6,778,876 B1
(45) Date of Patent: Aug. 17, 2004

(54) METHODS OF PROCESSING SUBSTRATES BASED UPON SUBSTRATE ORIENTATION

(75) Inventors: Elfido Coss, Jr., Austin, TX (US); Howard E. Castle, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/286,586

(22) Filed: Nov. 1, 2002

(51) Int. Cl.$^7$ ............................................. G06F 19/00
(52) U.S. Cl. ........................ 700/121; 700/95; 700/117; 438/5; 29/599
(58) Field of Search ............................ 700/90, 95, 117, 700/121; 438/14, 5; 324/71.5; 29/592.1, 599

(56) References Cited

U.S. PATENT DOCUMENTS

| | | | | |
|---|---|---|---|---|
| 5,917,332 A | * | 6/1999 | Chen et al. | 324/765 |
| 6,427,222 B1 | * | 7/2002 | Shau | 716/4 |
| 6,461,941 B2 | * | 10/2002 | Kim | 438/462 |
| 6,465,783 B1 | * | 10/2002 | Nakasuji | 250/311 |

* cited by examiner

*Primary Examiner*—Jayprakash N. Gandhi
(74) *Attorney, Agent, or Firm*—Williams, Morgan & Amerson, P.C.

(57) ABSTRACT

The present invention is generally directed to various methods of processing substrates based upon the substrate orientation. In one embodiment, the method comprises determining a defective die pattern of a process tool based upon an orientation of a semiconducting substrate in the tool during processing operations, positioning at least one subsequently processed semiconducting substrate in the process tool at an orientation selected to minimize defective die produced by the process tool, the selected orientation being based upon the determined defective die pattern of the process tool, and performing processing operations in the process tool on at least one subsequently processed substrate while at least one substrate is positioned in the process tool at the selected orientation. In another illustrative embodiment, the method comprises providing a plurality of semiconducting substrates to a processing tool, positioning each of the substrates within the tool at a selected orientation such that at least one electrical performance characteristic of at least one device formed on each of the substrates is optimized when a process operation is performed thereon in the process tool, and performing the processing operation on each of the substrates in the tool while each of the substrates is positioned at the selected orientation.

50 Claims, 13 Drawing Sheets performing at least one processing operation in a process tool on a first plurality of semiconducting substrates wherein each of the first plurality of substrates is positioned at a different orientation within the process tool during the at least one processing operation identifying a number of defective die produced on each of the first plurality of substrates performing the at least one processing operation on a second plurality of semiconducting substrates in the process tool wherein each of the second plurality of substrates is positioned at an orientation that is selected to minimize the number of defective die produced on each of the second plurality of substrates

Figure 14

METHODS OF PROCESSING SUBSTRATES BASED UPON SUBSTRATE ORIENTATION

BACKGROUND OF THE INVENTION

1. Field of the Invention

This invention relates generally to semiconductor fabrication technology, and, more particularly, to various methods of processing substrates based upon substrate orientation.

2. Description of the Related Art

There is a constant drive within the semiconductor industry to increase the operating performance of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. Moreover, the density of such transistors on a wafer per unit area has dramatically increased as a result of, among other things, the reduction in feature sizes, and an overall desire to minimize the size of various integrated circuit products.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors 10 formed above the substrate 11.

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above the semiconducting substrate 11. In general, semiconductor manufacturing operations involve, among other things, the formation of layers of various materials, e.g., polysilicon, metals, insulating materials, etc., and the selective removal of portions of those layers by performing known photolithographic and etching techniques. Semiconductor fabrication also involves performing various ion implantation processes to form various doped regions in the semiconducting substrate, performing various heat treatment processes, performing chemical mechanical polishing operations to planarize a surface, and performing various intermediate metrology operations to determine the accuracy of the manufacturing process. These processes are continued until such time as the integrated circuit device is complete.

Manufacturing integrated circuit products is a very complex process and it requires an extremely clean environment. Many different process steps may be performed to manufacture an integrated circuit. For example, 400–600 separate steps may be performed to complete the manufacture of a microprocessor. Such steps may involve, among other things, depositing a layer of material (deposition), forming a patterned photoresist layer above the deposited layer (photo), etching the deposited layer using the patterned photoresist layer as a mask (etch), and removing the patterned photoresist mask after the etch process is complete. The four recited steps are a very small portion of an overall process flow that is used to create an integrated circuit product. The number and combination of steps used to manufacture an integrated circuit product is determined by the nature and construction of the integrated circuit product. There is virtually an infinite variety of ways in which the various semiconductor manufacturing processes may be performed to create the final integrated circuit product. The various process operations are performed level-by-level until such time as the integrated circuit product is complete.

Despite great efforts to avoid them, a variety of different types of defects may be formed on an integrated circuit product during the course of manufacturing. For example, defects may include airborne particles, residual materials from previous process layers or operations, etc. Certain defects may be the result of improper processing, e.g., bridging between adjacent lines due to incomplete etching, etc. These defects may occur at any level of an integrated circuit product. Controlling the number, type and size of defects in modern integrated circuit manufacturing is a very important aspect of manufacturing operations. With today's sophisticated integrated circuit products with reduced feature sizes, even small levels of defects can severely degrade device performance or, in some cases, render integrated circuit products useless. Despite these efforts, defects still occur in semiconductor manufacturing due to the complexity of the processes used and the density and feature sizes of the devices that are formed. It is typically of interest to determine, among other things, the existence of defects and the defect density on an integrated circuit product as soon as possible so that various decisions may be made and various actions may be taken.

Additionally, the manufacture of integrated circuit products is a very competitive business. Manufacturers are under constant pressure to increase the yield of useful integrated circuit products that meet desired performance characteristics. For example, after an integrated circuit product is formed, it may be subjected to one or more electrical performance tests that are sometimes referred to as wafer electrical tests (WET). Such tests may include, for example, switching speeds, power consumption, etc. The completed integrated circuit products may be sorted based upon the results of the electrical tests. That is, for example, higher-performing parts may be separated from lower-performing parts and sold at higher prices due to their enhanced performance ability. Thus, it is critically important that yields in general be maximized in manufacturing integrated circuit products and, more particularly, that the production of higher-performing devices be increased.

The present invention is directed to various methods and systems that may solve, or at least reduce, some or all of the aforementioned problems.

SUMMARY OF THE INVENTION

The present invention is generally directed to various methods of processing substrates based upon the substrate orientation. In one illustrative embodiment (as indicated in FIG. 10), the method comprises determining a defective die pattern of a process tool based upon an orientation of a semiconducting substrate in the tool during processing operations, positioning at least one subsequently processed semiconducting substrate in the process tool at an orientation selected to minimize defective die produced by the process tool, the selected orientation being based upon the determined defective die pattern of the process tool, and performing processing operations in the process tool on at least one subsequently processed substrate while the substrate is positioned in the process tool at the selected orientation.

In another illustrative embodiment (as indicated in FIG. 11), the method comprises performing a process operation on a first semiconducting substrate in a process tool and identifying a location of an orientation mark of the first substrate when the process operation was performed on the first substrate in the process tool. The method further comprises, after the process operation is performed, identifying defective die on the first substrate and their location on the substrate, and positioning a second semiconducting substrate in the process tool at a selected orientation so as to minimize defective die formed on the second substrate, the selected orientation being determined based upon the location of the defective die on the first substrate and the orientation of the first substrate when the process operation was performed thereon.

In yet another illustrative embodiment (as indicated in FIG. 12), the method comprises selecting an orientation for a semiconducting substrate to be positioned in a process tool such that, when a processing operation is performed in the tool, the number of defective die formed above the substrate are minimized, positioning the substrate in the process tool at the selected orientation, and performing the processing operation on the substrate in the tool while the substrate is positioned at the selected orientation.

In still another illustrative embodiment (as indicated in FIG. 13), the method comprises providing a plurality of semiconducting substrates to a processing tool and positioning each of the substrates within the tool at a selected orientation such that the number of defective die formed on each of the substrates is minimized when a process operation is performed thereon in the process tool.

In a further illustrative embodiment (as indicated in FIG. 14), the method comprises performing at least one processing operation in a process tool on a first plurality of semiconducting substrates wherein each of the first plurality of substrates is positioned at a different orientation within the process tool during at least one processing operation, identifying a number of defective die produced on each of the first plurality of substrates, and performing at least one processing operation on a second plurality of semiconducting substrates in the process tool wherein each of the second plurality of substrates is positioned at an orientation that is selected to minimize the number of defective die produced on each of the second plurality of substrates.

In another illustrative embodiment, the method comprises determining a device electrical performance pattern of a process tool based upon an orientation of a semiconducting substrate in the tool during processing operations, positioning at least one subsequently processed semiconducting substrate in the process tool at an orientation selected such that at least one electrical performance characteristic of devices produced by the process tool is optimized, the selected orientation being based upon the determined device electrical performance pattern of the process tool, and performing processing operations in the process tool on at least one subsequently processed substrate while the substrate is positioned in the process tool at the selected orientation.

In still another illustrative embodiment, the method comprises providing a plurality of semiconducting substrates to a processing tool, positioning each of the substrates within the tool at a selected orientation such that at least one electrical performance characteristic of at least one device formed on each of the substrates is optimized when a process operation is performed thereon in the process tool, and performing the processing operation on each of the substrates in the tool while each of the substrates is positioned at the selected orientation. In further embodiments, the optimization involves maximizing the number of devices produced on a substrate wherein the electrical characteristic, e.g., drive current, switching speed, is greater than a preselected limit. In other embodiments, the method involves minimizing the number of devices wherein a particular electrical characteristic, e.g., leakage current, power consumption, exceeds a preselected allowable limit.

BRIEF DESCRIPTION OF THE DRAWINGS

The invention may be understood by reference to the following description taken in conjunction with the accompanying drawings, in which like reference numerals identify like elements, and in which:

FIGS. 10–14 depict illustrative embodiments of various methods disclosed herein in flowchart form.

Figure 1:
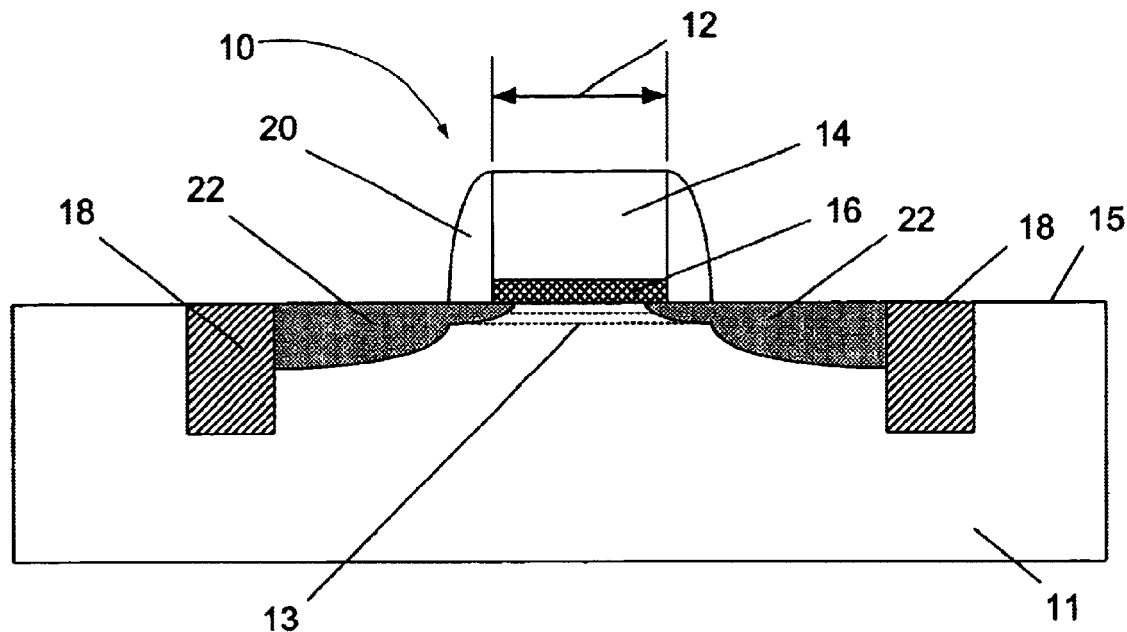
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures may or may not be as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of processing substrates based upon substrate orientation. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 2:
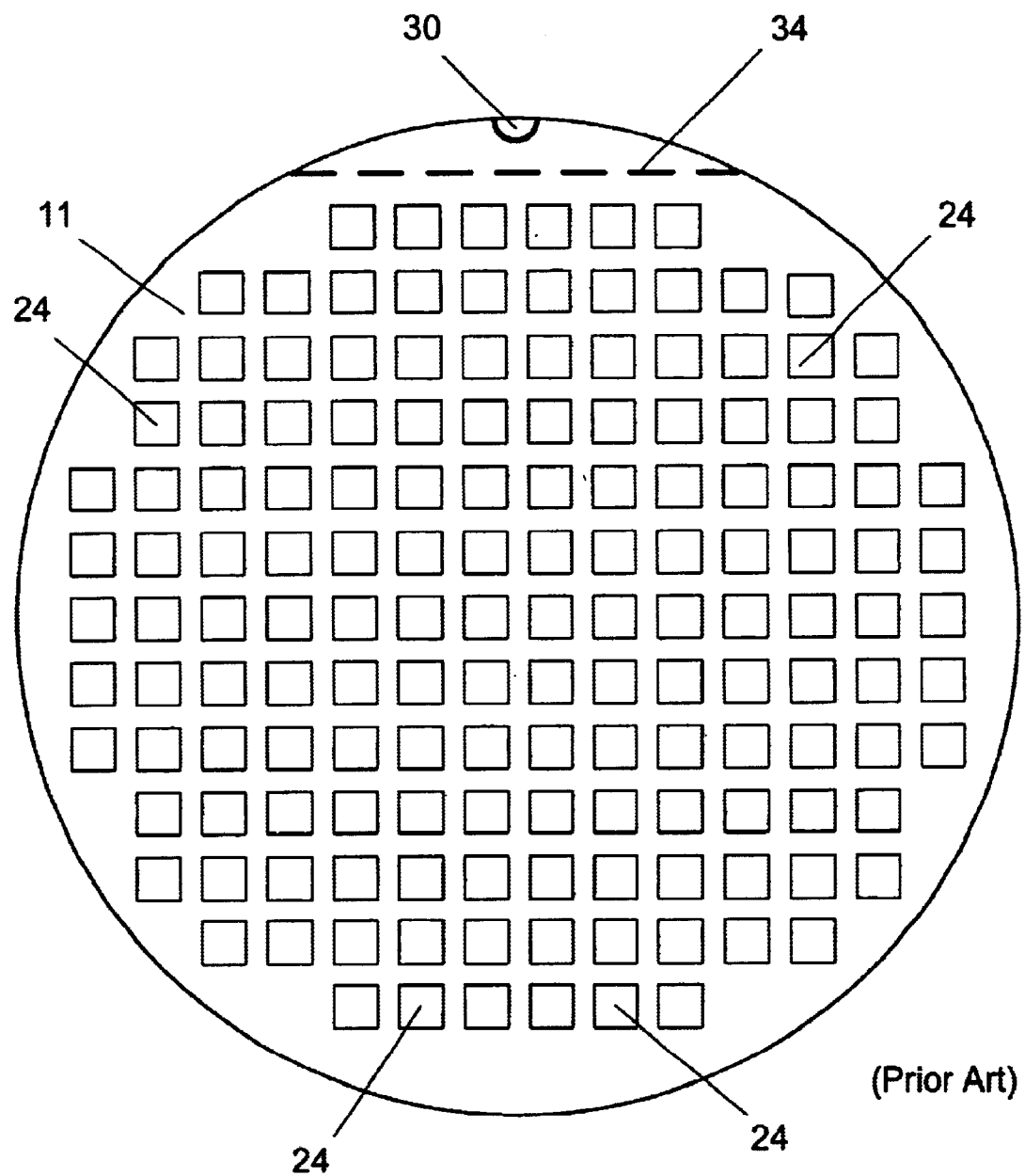
FIG. 2 is a plan view of a prior art semiconducting substrate having a plurality of production die formed thereabove.

As shown in FIG. 2, a plurality of production die 24 are formed above the semiconducting substrate 11. The substrate 11 may be comprised of any semiconducting material, e.g., silicon, germanium, SOI structures, etc. The die 24 define an area of the substrate 11 where production integrated circuit devices, e.g., microprocessors, ASICs, memory devices, etc., will be formed. The size, shape and number of die 24 per substrate 11 depend upon the type of device under construction. For example, 200–300 die 24 may be formed above an 8-inch diameter substrate 11. As the overall size of the substrate 11 continues to increase, e.g., to 12 inches (300 mm), the number of production die 24 formed above the substrate 11 will increase. For example, 300 mm substrates provide over twice as much surface area as that of 200 mm substrates.

The manufacture of substrates 11 for use in semiconductor manufacturing operations is a very complex process that involves, among other things, various shaping and polishing steps. Substrates are also provided with orientation marks for a variety of purposes. For substrates 11 less than approximately 150 mm in diameter, flats (primary and secondary in some cases) are ground along the edge of the substrate 11 (when it is in ingot form). For substrates having a diameter of 200 mm or more, a notch is typically formed on the edge of the substrate 11.

FIG. 2 depicts an illustrative orientation mark 30 formed on the edge 32 of the substrate 11. In the depicted embodiment, the orientation mark 30 that is formed on the edge 32 of the substrate 11 is a notch. Also depicted in FIG. 2 (in dashed lines) is a flat 34 that may also serve as an orientation mark 30. If a notch is used as the orientation mark 30, it may have a depth of approximately 1 mm and the notch axis, i.e., a line through the center of the notch to the center of the substrate, identifies the <110> crystal orientation of the substrate 11. A pin (not shown) is typically used to find the notch and, thus, align the substrate 11. The primary flat 34, if used, may also represent a specific orientation of the crystalline structure of the substrate 11. Secondary flats, if used, may signify other characteristics of the substrate 11, such as the type of dopant material in the substrate, e.g., N-type, and/or additional crystal orientations. As will be recognized by those skilled in the art after a complete reading of the present application, the present invention is not limited to the use of any particular type of orientation mark 30 unless such limitations are expressly set forth in the appended claims.

Figure 3:
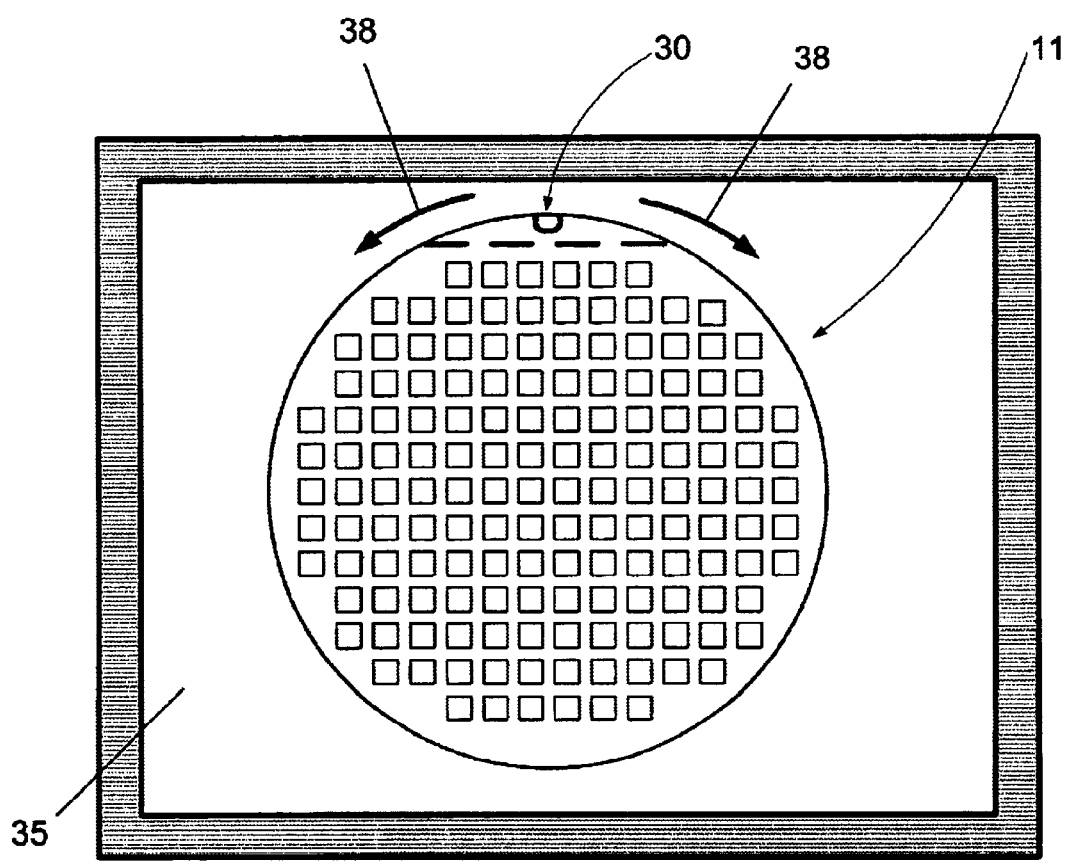
FIG. 3 is a cross-sectional, plan view of a schematically depicted process tool having a substrate positioned therein.

In general, the present invention is directed to various methods whereby the number of defective die 24 per substrate 11 is minimized by properly orienting the substrate 11 within a process tool. FIG. 3 is a cross-sectional, plan view of a portion of a schematically depicted process tool 35 wherein the substrate 11 is positioned therein. The orientation mark 30 of the substrate 11 may be rotated to any desired location, as indicated by the arrows 38, i.e., from 0–360° (in any desired increments). Of course, as will be understood by those skilled in the art after a complete reading of the present application, the application is not limited by the plane, e.g., horizontal or vertical, in which the substrate 11 is positioned. The substrate 11 may be positioned and oriented in the process tool 35 manually or through use of known automated handling equipment (not shown). The process tool 35 may be a deposition tool, an etch tool, an ion implantation tool, a photolithography tool, a resist removal tool, a cleaning tool or a wet etch tool, etc.

In one aspect, the present invention involves identifying defective die 24 on the substrate 11. The identification of defective die 24 may be based upon a defect analysis or the results of one or more electrical tests to be performed on the die 24. Additionally, such defective die 24 may be determined by performing one or more metrology tests to measure a physical characteristic of one or more features formed above the substrate 11, e.g., the critical dimension of the gate electrodes formed on the die 24. If the measured critical dimension does not fall within allowable limits, then the die 24 may be deemed to be defective. The tests or analysis used to determine the evidence of defective die 24 may be performed at any point during the processing of the substrate 11. For example, in one embodiment, such testing may be performed immediately after the substrate 11 has been processed in the process tool 35. Moreover, the tests or analysis performed to determine the existence of defective die 24 may be performed at any level of the die 24. For ease of reference, reference will be made to a generic metrology tool that may be used as part of the process of identifying defective die 24 by performing, for example, a defect analysis, electrical testing and/or physical measurements. For example, in the case of defect analysis, the metrology tool may be a scanning electron microscope used to inspect for the existence of defects while for electrical testing the metrology tool may be a four point probe.

If defect analysis is employed, it may be based upon the size, number, type and/or location of the defects. If electrical testing is performed to determine defective die 24, it may be any type of electrical test and it may be performed at any point during the manufacture of the integrated circuit products. Such electrical testing may involve testing the resistance, power consumption and/or operating frequency of the integrated circuit devices formed on the substrate 11.

Figure 4:
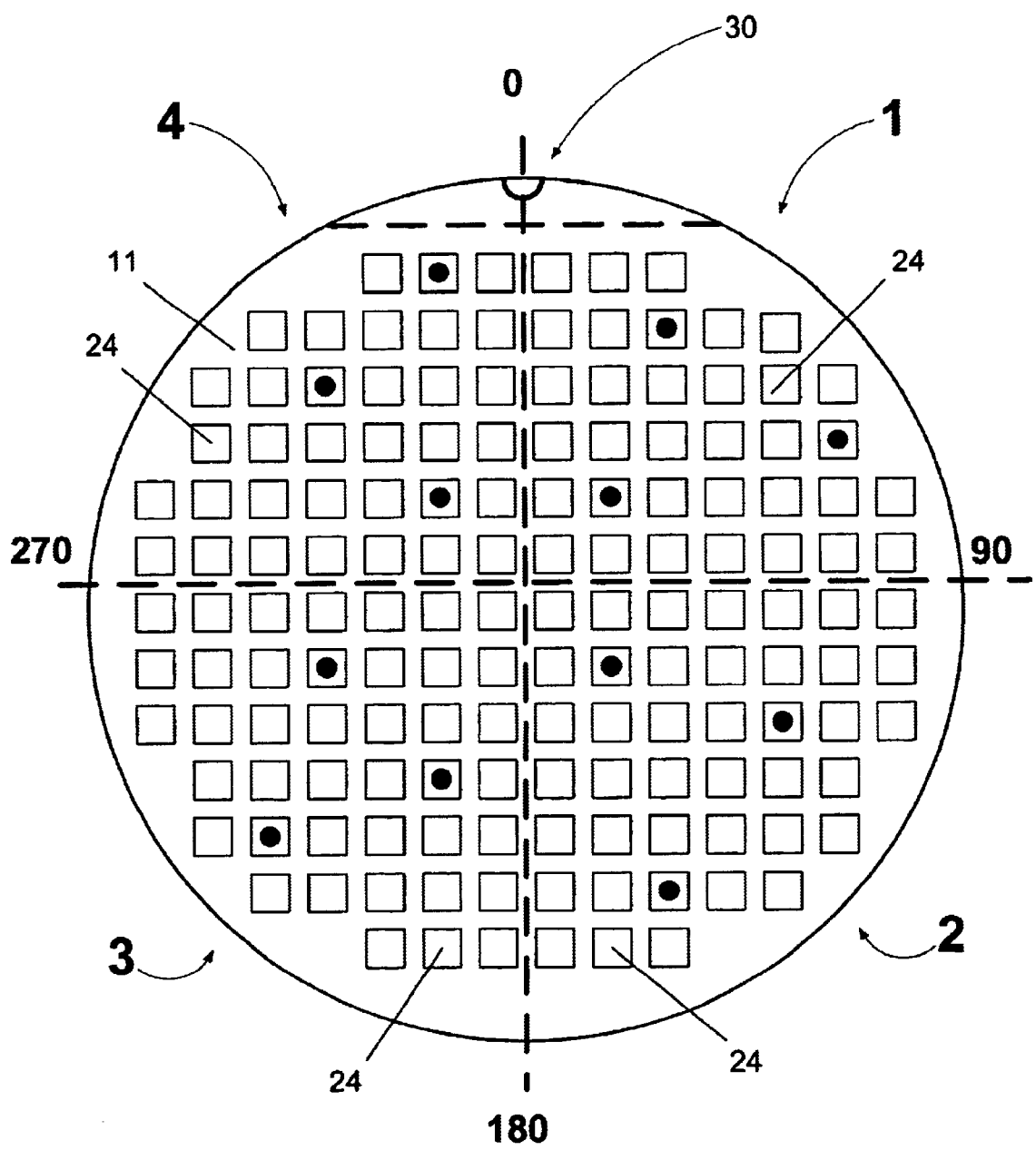
FIG. 4 is a plan view of a semiconducting substrate with a plurality of production die formed thereabove wherein the substrate has been segregated into illustrative regions in accordance with one illustrative embodiment of the present invention.
Figure 5:
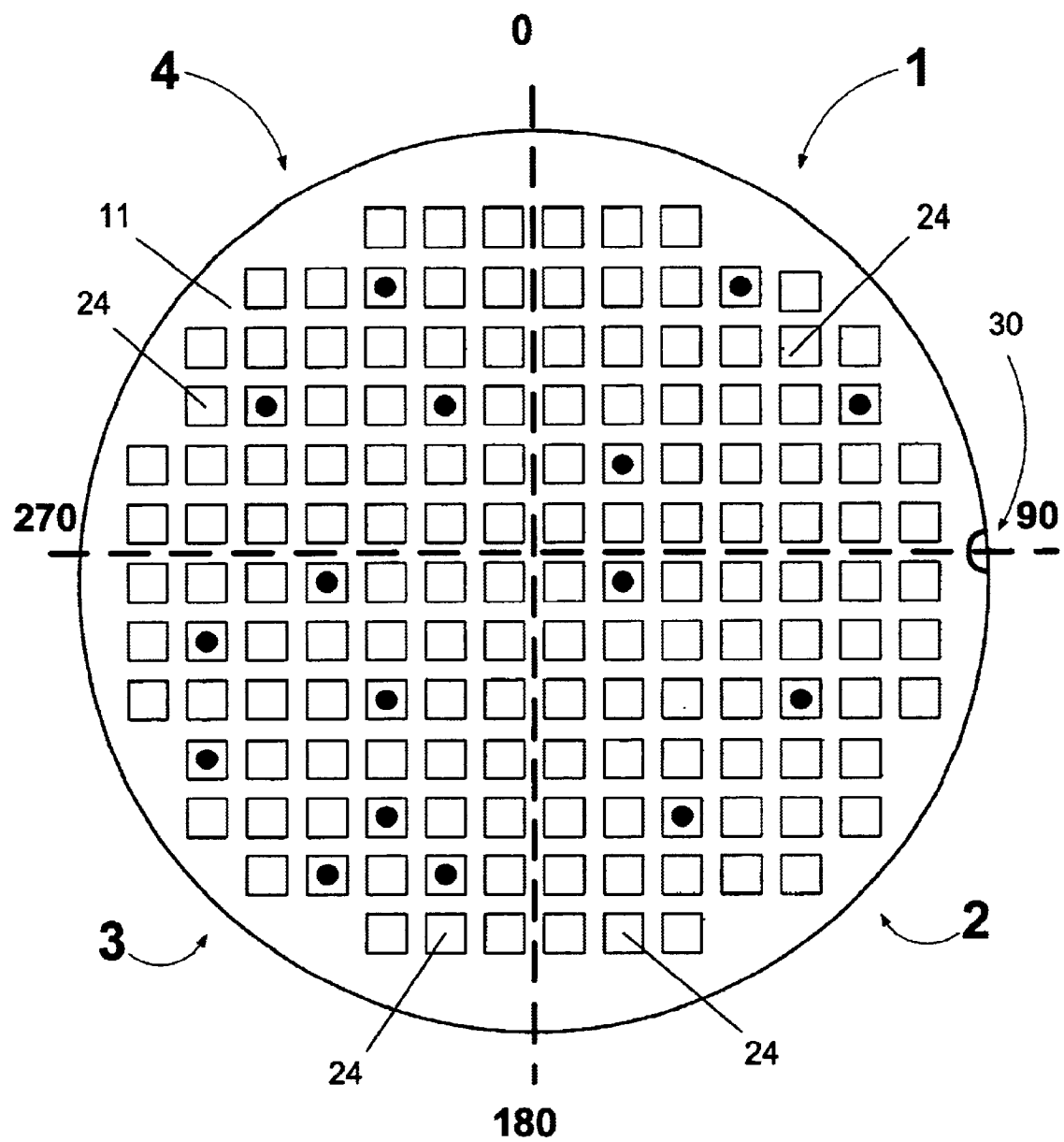
FIG. 5 is another example of a semiconductor substrate that may be processed in accordance with the teachings of the present invention.
Figure 6:
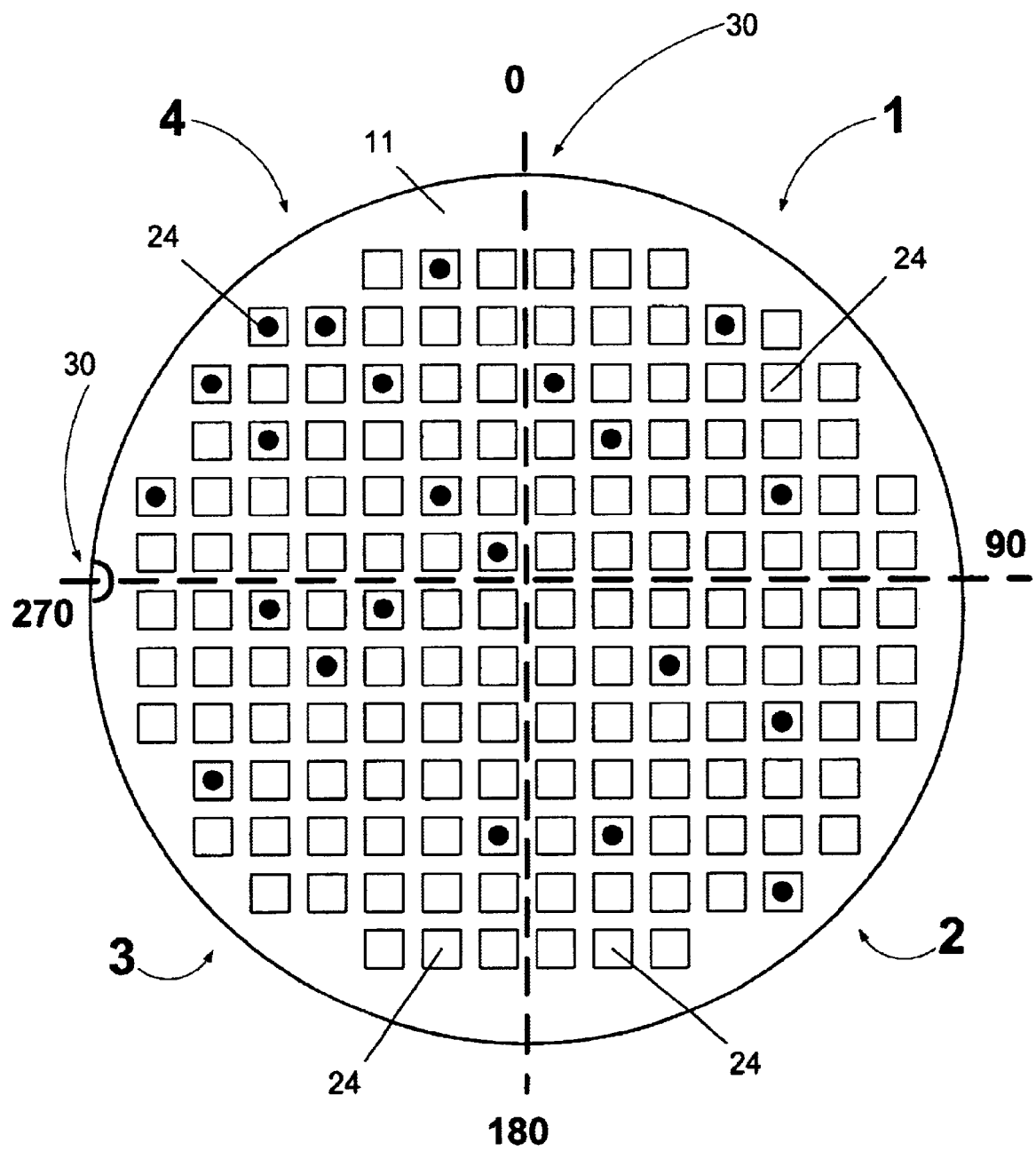
FIG. 6 is another example of a semiconductor substrate that may be processed in accordance with the teachings of the present invention.

FIGS. 4–6 are provided to provide further explanation of the present invention. As shown in FIG. 4, the substrate 11 has been divided into four arbitrarily selected regions 1–4. The substrate 11 may be divided into as many arbitrary regions as desired, and the regions may be of any shape or configuration. For ease of reference, illustrative degree markings, i.e., 0°, 90°, 180° and 270°, have been indicated on FIG. 4. The referenced degree markings may be used to establish the orientation of the substrate 11 within the process tool 35. Of course, any means or method of determining the orientation of the substrate 11 as it is processed in the process tool 35 may be employed. Defective die 24 are indicated by a dot positioned on the die 24. The defective die 24 may be determined in the various manners described above. In general, in one aspect, the present invention involves determining the defective die 24 produced by a process tool 35 based upon the orientation of the substrate 11 within the tool 35 when processing operations were performed on the substrate 11. As a simplistic example, a deposition tool may produce a different number of defective die 24 when the substrate 11 is processed with the orientation mark 30 positioned at zero degrees as compared to when the orientation mark is at 90 degrees, for example. Not only may the number of defective die 24 vary, but there may also be a variance in the nature of the cause of the defective die 24. That is, when the substrate 11 is at zero degrees, the number of defective die 24 due to particle contamination may be less than when the substrate 11 is oriented at 180 degrees.

As shown in FIG. 4, there are 12 defective die 24 and they are randomly spaced around the substrate 11. In FIG. 5, however, where the orientation mark 30 is located at 90°, there are a total of 16 defective die 24 and the number of defective die 24 tend to be more concentrated in region 3. In FIG. 6, the orientation mark is located at 270°, and there are a total of 22 defective die 24 with the greatest concentration being in region 4. Thus, based upon this information, all other things being equal, it would be desirable if substrates 11 processed in the process tool 35 were oriented at zero degrees to minimize the number of defective die 24 formed on the substrate 11.

In one embodiment, the present invention involves determining a defective die 24 pattern produced by a process tool 35 based upon the orientation (as determined by the orientation mark 30) of the substrate 11 within the process tool 35 during processing operations or based upon the x, y and/or z coordinates of the wafer stage. This may be determined by processing a number of substrates at a variety of different orientations and examining the number of defective die 24 produced at the various orientations. The number of substrates processed to determine the defective die 24 pattern of the process tool 35 may vary depending upon the judgment of the appropriate process engineer. Moreover, this defective die 24 pattern may be process tool 35 specific and/or product specific. Once the defective die 24 pattern of the tool 35 is determined, subsequently processed substrates 11 are positioned in the process tool 35 at an orientation selected to minimize defective die 24 produced by the process tool 35. Thereafter, processing operations are performed on substrates that are positioned at the selected orientation. Through this methodology, the number of defective die 24 produced on a substrate 11 may be reduced.

In other embodiments, the method involves performing a process operation on a first semiconducting substrate in the process tool 35, and identifying the location of the orientation mark 30 of the first substrate 11 when the process operation was performed on the first substrate in the process tool 35. The method further comprises, after the process operation is performed, identifying defective die 24 on the first substrate 11 and their location on the substrate 11 and positioning a second semiconducting substrate in the process tool 35 at a selected orientation so as to minimize defective die 24 formed on the second substrate, wherein the selected orientation is determined based upon the location of the defective die 24 on the first substrate and the orientation of the first substrate when the process operations were performed thereon.

In yet another illustrative embodiment, the method comprises selecting an orientation for a semiconducting substrate to be positioned in a process tool 35 such that, when a processing operation is performed in the tool 35, the number of defective die 24 formed above the substrate are minimized, positioning the substrate in the process tool 35 at the selected orientation, and performing the processing operation on the substrate in the tool 35 while the substrate is positioned at the selected orientation.

In still another illustrative embodiment, the method comprises providing a plurality of semiconducting substrates to a processing tool 35 and positioning each of the substrates within the tool at a selected orientation such that the number of defective die formed on each of the substrates is minimized when a process operation is performed thereon in the process tool.

In a further illustrative embodiment, the method comprises performing at least one processing operation in a process tool 35 on a first plurality of semiconducting substrates wherein each of the first plurality of substrates is positioned at a different orientation within the process tool during at least one processing operation, identifying a number of defective die 24 produced on each of the first plurality of substrates, and performing at least one processing operation on a second plurality of semiconducting substrates in the process tool 35 wherein each of the second plurality of substrates is positioned at an orientation that is selected to minimize the number of defective die 24 produced on each of the second plurality of substrates.

Figure 7:
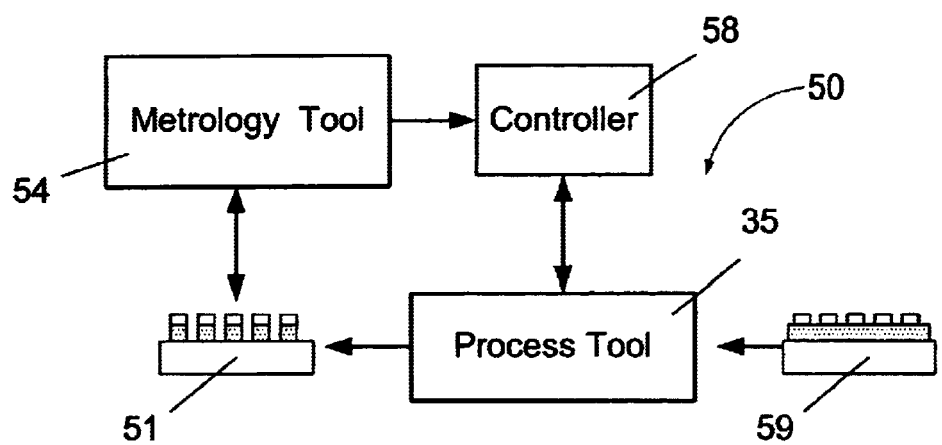
FIG. 7 depicts an illustrative embodiment of a system in accordance with one embodiment of the present invention.

An illustrative system 50 that may be used in one embodiment of the present invention is shown in FIG. 7. The system 50 is comprised of a metrology tool 54, a process tool 35, and a controller 58. As indicated in FIG. 7, the substrate 51 is representative of one or more substrates that have been processed in the process tool 35. The metrology tool 54 may be used as part of the process to determine the existence and/or location of defective die 24 on the substrate 51. As stated previously, the particular type of metrology tool employed will depend upon how defective die 24 are determined, e.g., defect analysis, electrical testing, physical measurement, etc. Thus, the metrology tool 54 should not be considered as limited to any particular type of tool unless such limitations are clearly set forth in the appended claims. Through use of the metrology tool 54, defective die 24 may be identified on the substrate 51. The controller 58 is provided with the number and location of the defective die 24 and, in some cases, the nature of the cause of the defective die 24, e.g., failed electrical testing, point defect, etc. The controller 58 is also provided with the orientation of the substrate 51 as it was processed in the process tool 34. Such orientation data may be provided to the controller by sensing mechanisms well known to those skilled in the art.

After processing a number of substrates, the controller 58 may be used to determine a defective die 24 pattern produced by the process tool 35. Then, in one embodiment, the controller 58 may control the positioning of subsequently processed substrates, as represented by illustrative substrate 59, in the process tool 35. Even more specifically, the controller 58 may control or command the positioning of the orientation mark 30 of the to be processed substrates 59 at a location selected to minimize the number of defective die 24 produced on the substrate 59. The to be processed substrates 59 may all be oriented in the selected position prior to being sent to the process tool 35 or each individual substrate 59 may be oriented at the selected orientation by the process tool 35 prior to processing in the tool 35. Orienting the substrates may be accomplished using known substrate handling and sensing equipment.

In the illustrated embodiments, the controller 58 is a computer programmed with software to implement the functions described herein. Moreover, the functions described for the controller 58 may be performed by one or more controllers spread through the system. For example, the controller 58 may be a fab level controller that is used to control processing operations throughout all or a portion of a semiconductor manufacturing facility. Alternatively, the controller 58 may be a lower level computer that controls only portions or cells of the manufacturing facility. Moreover, the controller 58 may be a stand-alone device, or it may reside on the metrology tool 54 or on the process tool 35. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 58, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 8:
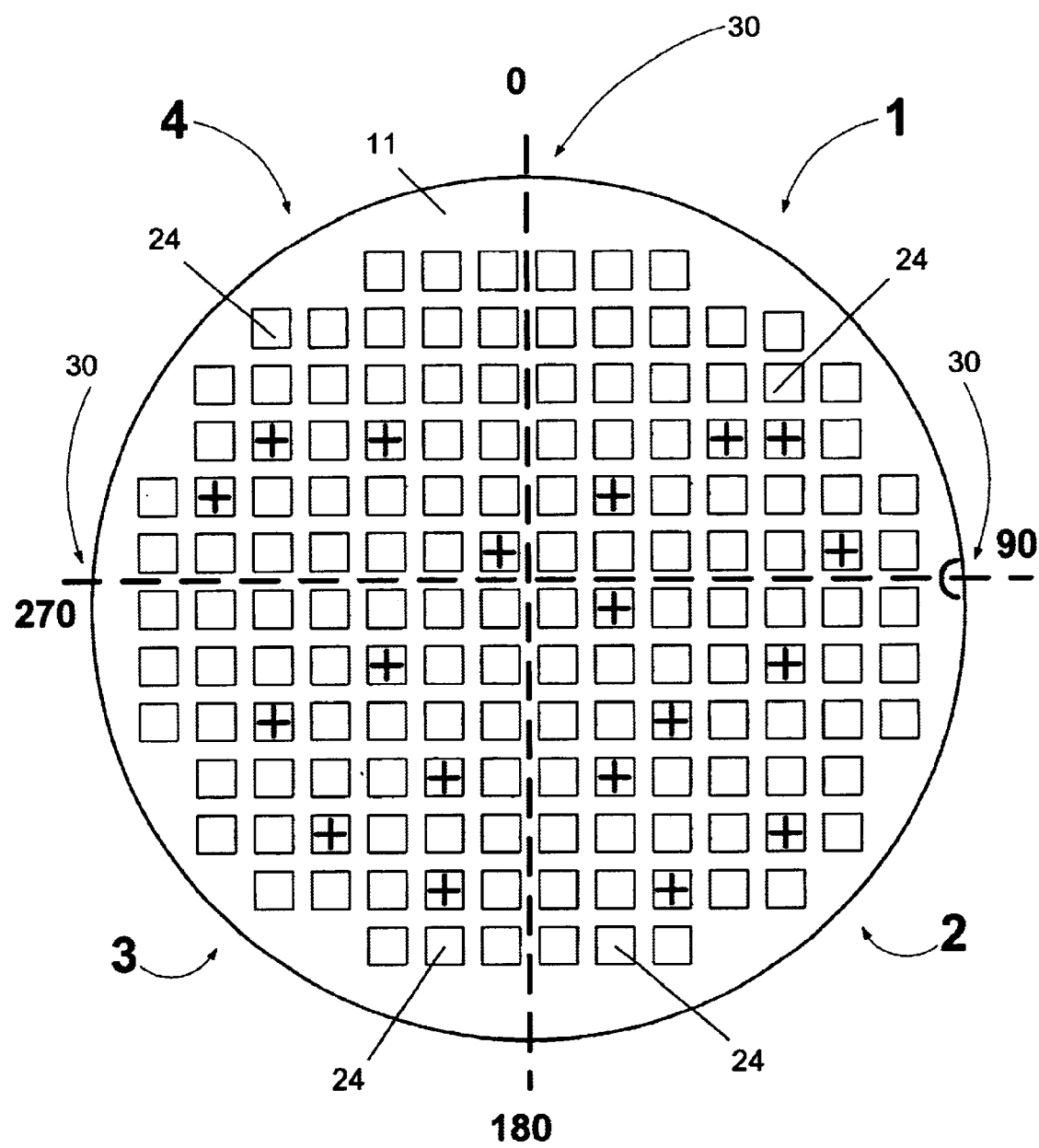
FIGS. 8–9 depict other embodiments of substrates that may be processed in accordance with another aspect of the present invention so as to optimize electrical performance characteristics.
Figure 9:
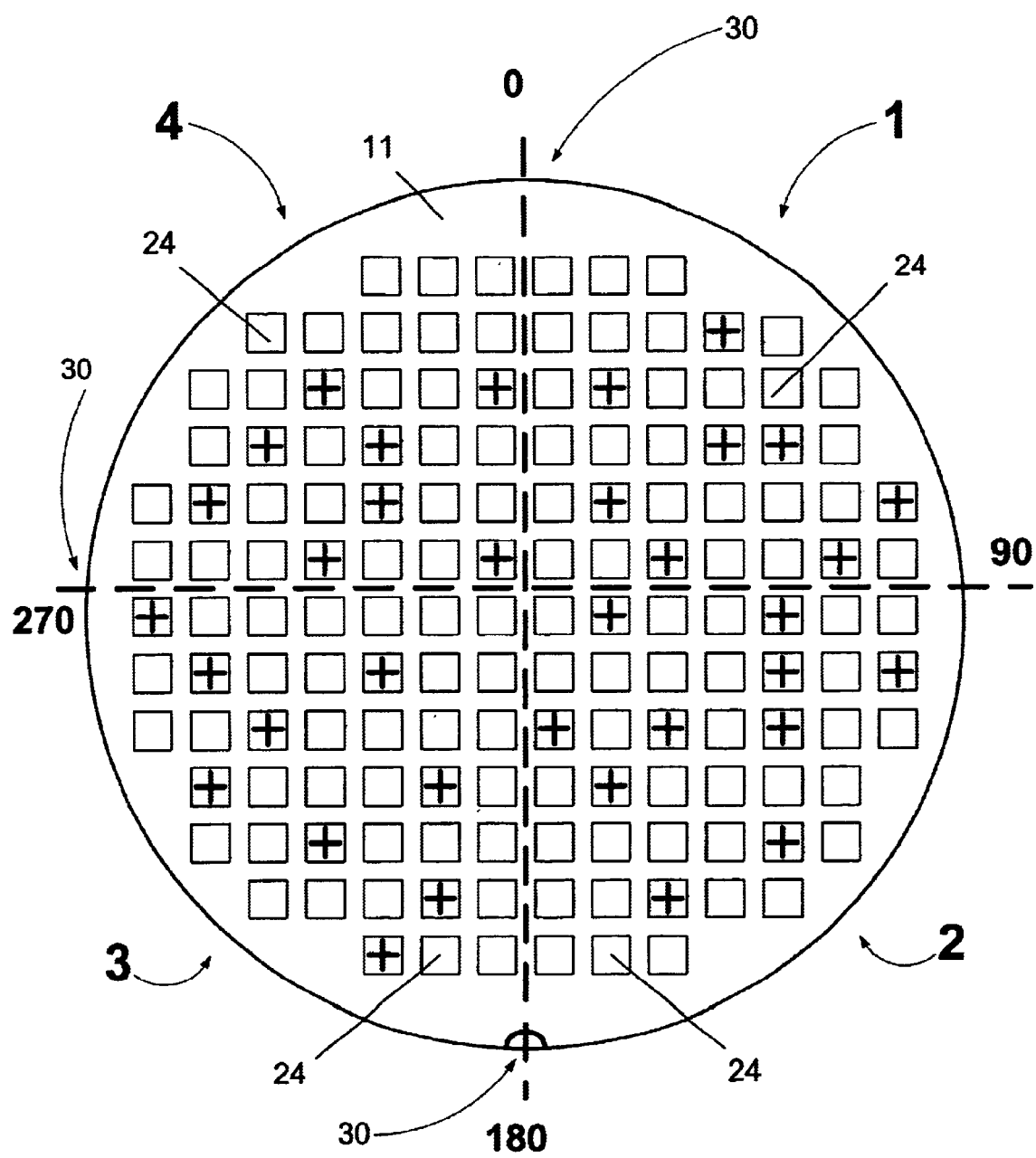
Figure 10:
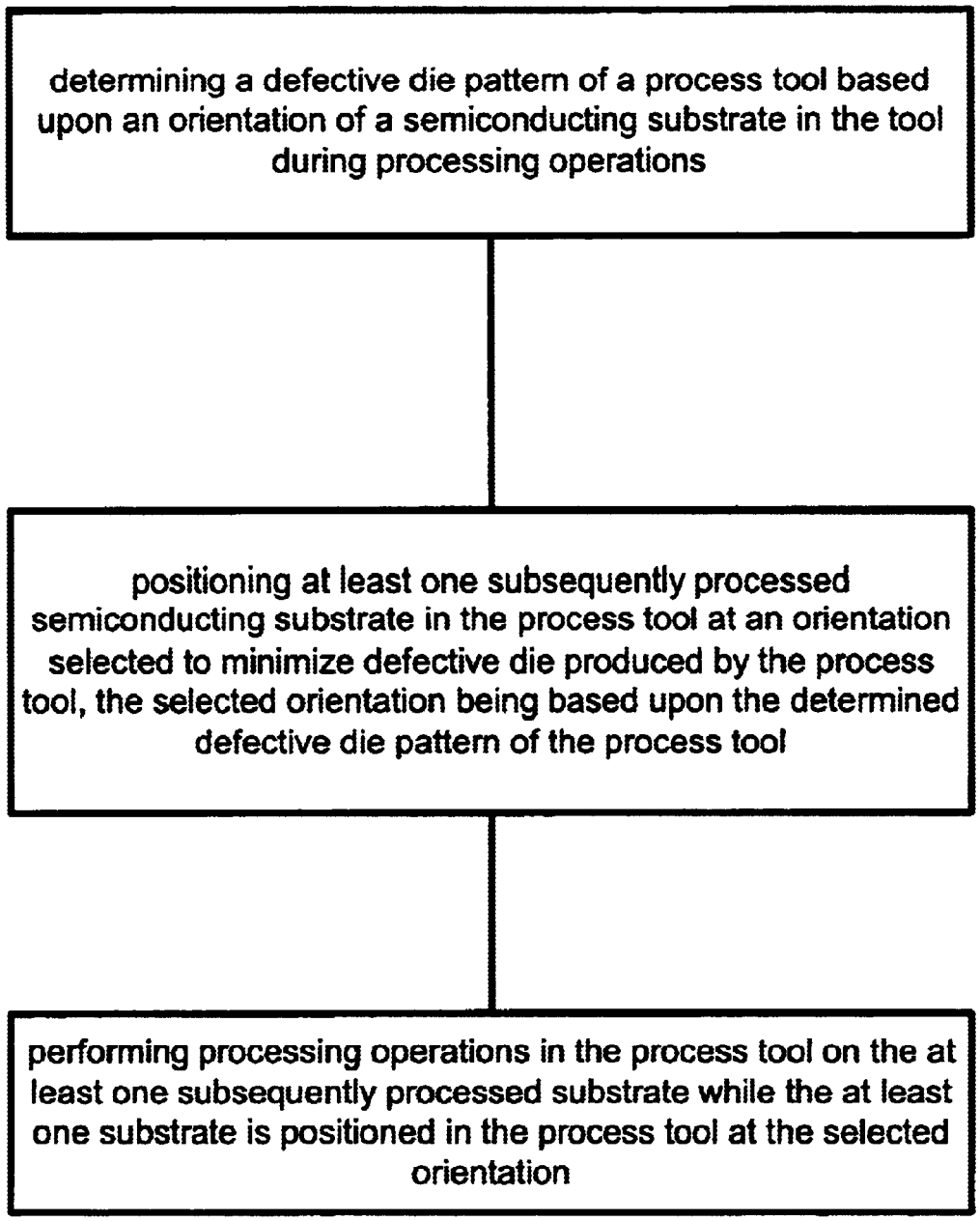
Figure 11:
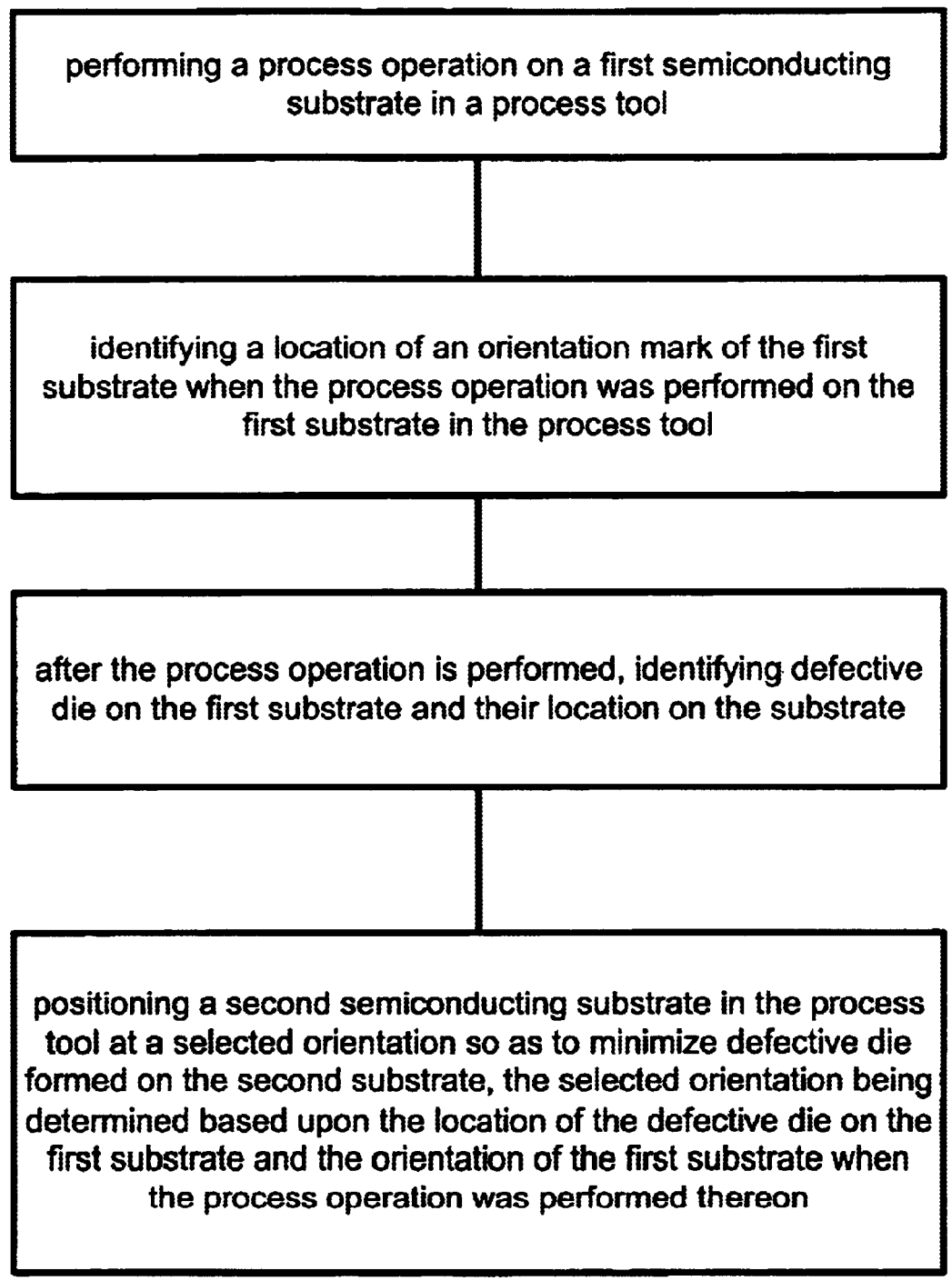
Figure 12:
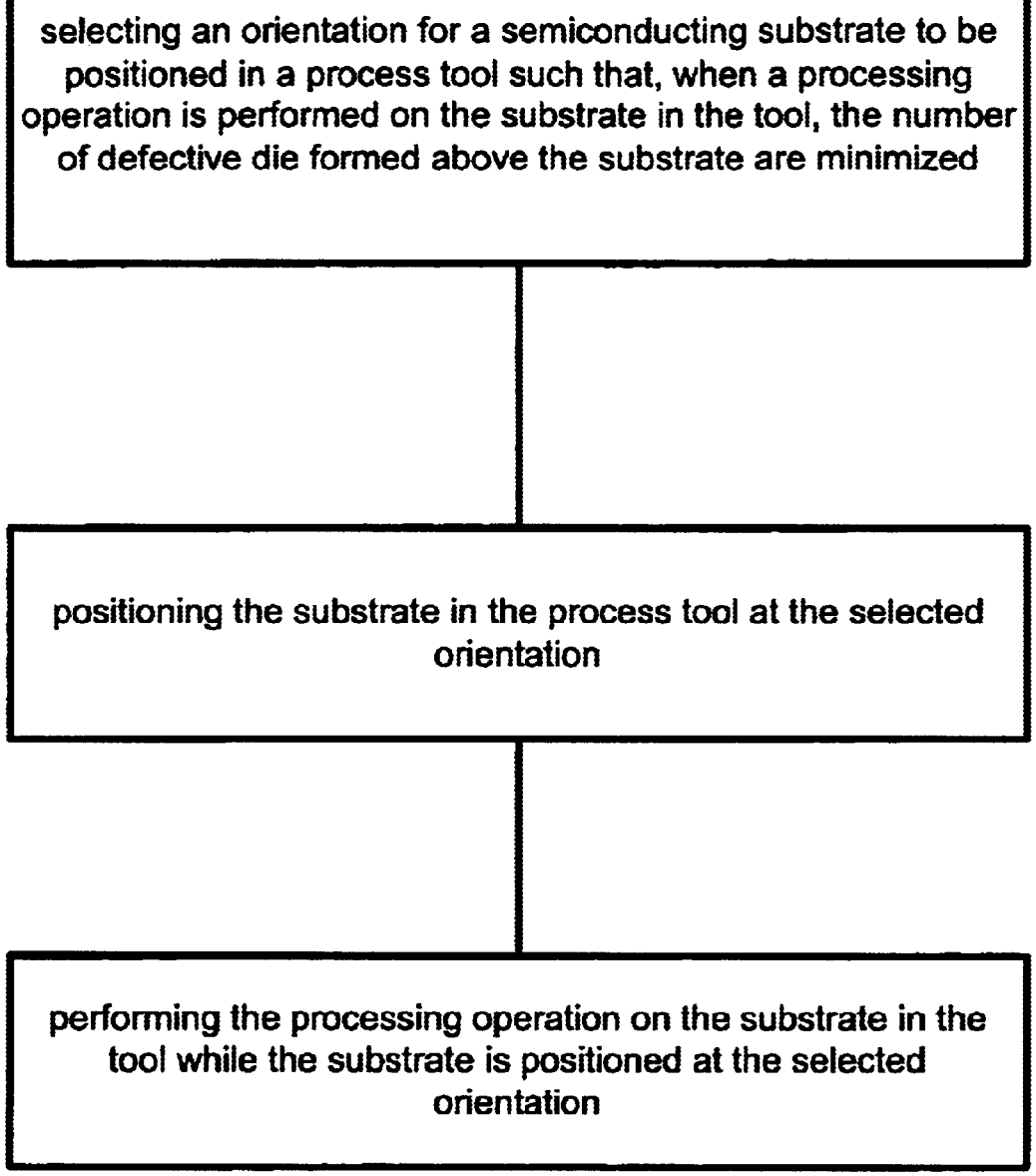
Figure 13:
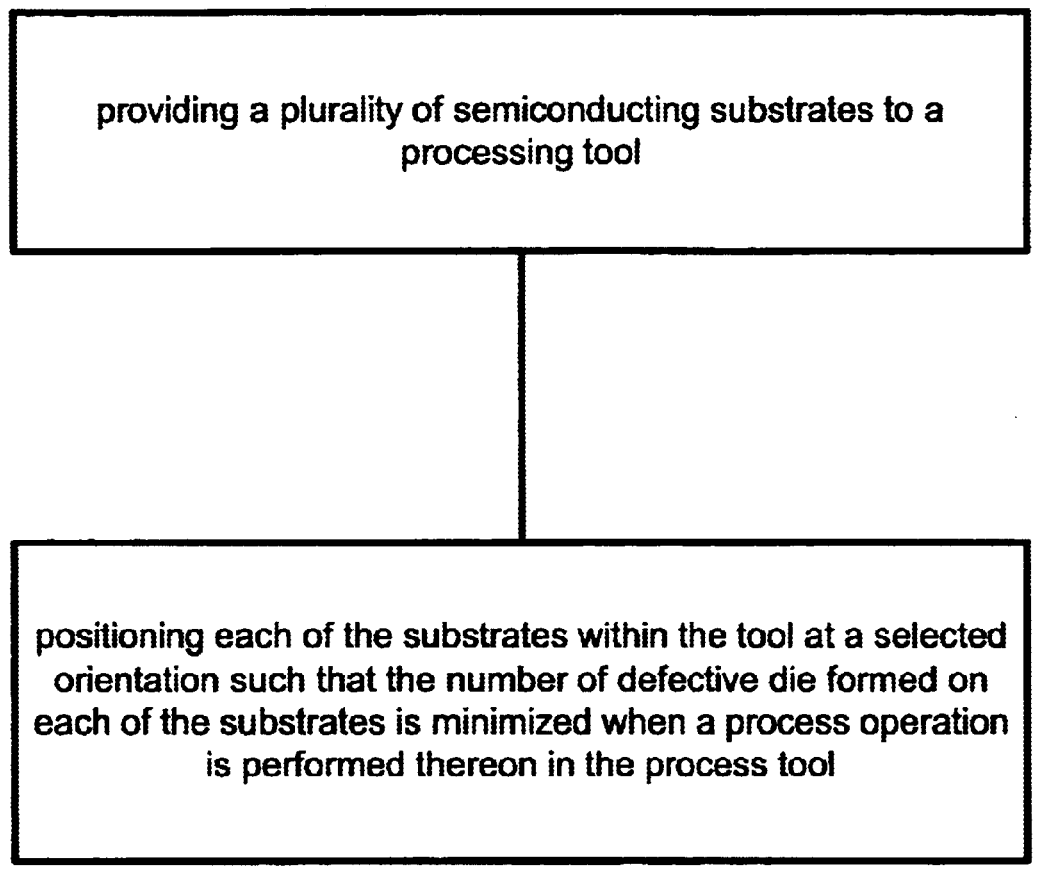

In another aspect, the present invention is generally directed to optimizing electrical performance characteristics of devices formed above a substrate based upon the orientation of a substrate during processing operations. For example, devices processed in a particular process tool, e.g., an etch tool, may produce a larger number of high performance devices, e.g., devices that operate at a higher frequency, when the substrates are positioned at a certain orientation within the process tool 35. FIGS. 8 and 9 depict illustrative embodiments where the substrates 11 are processed in the process tool 35 with the substrate 11 orientation at 90° (FIG. 8) and at 180° (FIG. 9). The illustrative orientations are provided by way of example only.

Various metrology tests may be performed to determine at least one electrical performance characteristic of the devices formed above the substrate 11. For example, in the case where the electrical characteristic of interest is operating frequency, a "+" symbol is used to indicate the devices that exceed a preselected performance level. In FIG. 8 (where the substrate is oriented at 90°), there are 19 such devices, while in FIG. 9 (where the substrate is oriented at 180°), there are 35 of such high speed devices. Thus, all other things being equal, it would be desirable to process all substrates 11 in the process tool 35 at a substrate orientation of 180° so as to optimize the electrical performance characteristics of at least some of the devices formed above the substrate. More specifically, this orientation may be selected so as to maximize the number of integrated circuit products that exhibit at least this preselected electrical performance characteristic. This, in turn, will hopefully result in production of a greater number of higher speed devices, which translates into greater profitability.

Of course, as will be recognized by those skilled in the art after a complete reading of the present application, the present invention may be employed in the context of optimizing any of a variety of different electrical performance characteristics of the devices formed above the substrate. For example, electrical performance characteristics, such as drive current and operating frequency of the device, may be optimized by increasing or maximizing these values on at least some of the devices formed above the substrate 11 or by maximizing the number of devices that exhibit at least preselected levels of one or more of these characteristics. Alternatively, an electrical performance characteristic, such as leakage current or power consumption, may be optimized by decreasing or minimizing these parameters on one or more of the devices formed above the substrate 11 or by minimizing the number of devices wherein the particular electrical characteristic exceeds a preselected allowable limit for such characteristic. Additionally, it should be understood that the term "device" includes any type of semiconductor device or integrated circuit product, e.g., a transistor, a memory cell, a capacitor, a microprocessor, a memory array, an SRAM device, etc. Thus, the present invention should not be considered as limited to any particular type of device or any particular electrical performance characteristic unless such limitations are clearly set forth in the appended claims.

The electrical performance characteristics of the devices and/or the device electrical performance characteristic pattern produced by a process tool 35 may be determined based upon one or more electrical performance tests. Such electrical testing may be performed by the illustrative metrology tool 54. The particular metrology tool 54 employed will vary depending on the type of electrical characteristic performance test that is performed.

In one illustrative embodiment, the method comprises determining a device electrical performance pattern of a process tool 35 based upon an orientation of a semiconducting substrate in the tool during processing operations, positioning at least one subsequently processed semiconducting substrate 11 in the process tool 35 at an orientation selected such that at least one electrical performance characteristic of devices produced by the process tool 35 is optimized, the selected orientation being based upon the determined device electrical performance pattern of the process tool 35, and performing processing operations in the process tool 35 on at least one subsequently processed substrate 11 while the substrate is positioned in the process tool 35 at the selected orientation. The device electrical pattern of the process tool 35 may be determined based upon various electrical performance tests. The pattern may simply be representative of a number of devices that meet preselected standards for various electrical characteristics. Alternatively, the device electrical pattern may be geographical in nature. That is, the metrology data may indicate that more devices of a certain electrical characteristic are produced in one of the regions 1–4 as compared to any of the other regions 1–4. In further embodiments, the method comprises selecting the orientation of the substrate to maximize the number of devices wherein the electrical characteristics of interest, e.g., drive current, exceed a preselected value for the electrical performance characteristic. In other embodiments, the orientation is selected to minimize the number of devices wherein the electrical characteristic of interest, e.g., power consumption, exceeds a preselected allowable limit for the electrical characteristic.

In another illustrative embodiment, the method comprises performing a process operation on a first semiconducting substrate in a process tool 35 and identifying a location of an orientation mark of the first substrate 11 when the process operation was performed on the first substrate 11 in the process tool 35. The method further comprises, after the process operation is performed, identifying at least one electrical performance characteristic of at least one device formed on the first substrate, and positioning a second semiconducting substrate in the process tool at a selected orientation such that at least one electrical performance characteristic of at least some devices formed on the second substrate is optimized, the selected orientation being determined based upon the at least one electrical characteristic and the orientation of the first substrate when the process operation was performed thereon.

In yet another illustrative embodiment, the method comprises providing a plurality of semiconducting substrates to a processing tool, positioning each of the substrates within the tool at a selected orientation such that at least one electrical performance characteristic of at least one device formed on each of the substrates is optimized when a process operation is performed thereon in the process tool, and positioning the substrates in the process tool at the selected orientation and performing the processing operation on each of the substrates in the tool while the substrates are positioned at the selected orientation.

Through use of the present invention, better process control may be achieved in modern integrated circuit manufacturing facilities. Additionally, the present invention may result in improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:

determining a defective die pattern of a process tool based upon an orientation of a semiconducting substrate in said tool during processing operations;

positioning at least one subsequently processed semiconducting substrate in said process tool at an orientation selected to minimize defective die produced by said process tool, said selected orientation being based upon said determined defective die pattern of said process tool; and performing processing operations in said process tool on said at least one subsequently processed substrate while said at least one substrate is positioned in said process tool at said selected orientation.

2. The method of claim 1, wherein said process tool is comprised of at least one of a deposition tool, an etch tool, an ion implantation tool, a photolithography tool, a resist removal tool and a cleaning tool.

3. The method of claim 1, wherein said defective die pattern is determined based upon a defect analysis.

4. The method of claim 1, wherein said defective die pattern is determined based upon results of at least one electrical performance test.

5. The method of claim 1, wherein said defective die pattern is determined based upon measurement of a physical characteristic of at least one feature.

6. The method of claim 1, wherein said semiconducting substrate is comprised of silicon.

7. The method of claim 1, wherein said defective die pattern of said process tool is determined by:

processing a plurality of semiconducting substrates in said process tool;

identifying an orientation of each of said substrates in said tool during processing operations;

identifying a location of at least one defective die on each of said plurality of processed substrates; and for each of said plurality of substrates, associating said identified location of said defective die with said identified orientation of each of said substrates.

8. The method of claim 1, wherein positioning said at least one subsequently processed substrate in said process tool comprises inserting said substrate in said process tool and rotating said substrate to said selected orientation.

9. The method of claim 1, wherein positioning said at least one subsequently processed substrate in said process tool comprises positioning said substrate to said selected orientation prior to inserting said substrate into said process tool.

10. The method of claim 1, wherein said orientation of said substrate is determined based upon a location of a notch on said substrate.

11. The method of claim 1, wherein said orientation of said substrate is determined based upon a location of a flat on said substrate.

12. A method, comprising:

performing a process operation on a first semiconducting substrate in a process tool;

identifying a location of an orientation mark of said first substrate when said process operation was performed on said first substrate in said process tool;

after said process operation is performed, identifying defective die on said first substrate and their location on said substrate; and positioning a second semiconducting substrate in said process tool at a selected orientation so as to minimize defective die formed on said second substrate, said selected orientation being determined based upon the location of said defective die on said first substrate and said orientation of said first substrate when said process operation was performed thereon.

13. The method of claim 12, wherein said process tool is comprised of at least one of a deposition tool, an etch tool, an ion implantation tool, a photolithography tool, a resist removal tool and a cleaning tool.

14. The method of claim 12, wherein identifying defective die comprises identifying defective die based upon a defect analysis.

15. The method of claim 12, wherein identifying defective die comprises identifying defective die based upon results of at least one electrical test.

16. The method of claim 12, wherein said defective die are identified based upon measurement of a physical characteristic of at least one feature.

17. The method of claim 12, wherein positioning said second semiconducting substrate in said process tool comprises inserting said substrate in said process tool and rotating said substrate to said selected orientation.

18. The method of claim 12, wherein positioning said at least one subsequently processed substrate in said process tool comprises positioning said substrate to said selected orientation prior to inserting said substrate into said process tool.

19. The method of claim 12, wherein said orientation of said substrate is determined based upon a location of a notch on said substrate.

20. The method of claim 12, wherein said orientation of said substrate is determined based upon a location of a flat on said substrate.

21. A method, comprising:

selecting an orientation for a semiconducting substrate to be positioned in a process tool such that, when a processing operation is performed on said substrate in said tool, the number of defective die formed above the substrate are minimized;

positioning said substrate in said process tool at said selected orientation; and performing said processing operation on said substrate in said tool while said substrate is positioned at said selected orientation.

22. The method of claim 21, wherein said process tool is comprised of at least one of a deposition tool, an etch tool, an ion implantation tool, a photolithography tool, a resist removal tool and a cleaning tool.

23. The method of claim 21, wherein said defective die are determined based upon the results of a defect analysis.

24. The method of claim 21, wherein said defective die are determined based upon results of at least one electrical performance test.

25. The method of claim 21, wherein said defective die are determined based upon measurement of a physical characteristic of at least one feature.

26. The method of claim 21, wherein said semiconducting substrate is comprised of silicon.

27. The method of claim 21, wherein positioning said substrate in said process tool comprises inserting said substrate in said process tool and rotating said substrate to said selected orientation.

28. The method of claim 21, wherein positioning said substrate in said process tool comprises positioning said substrate to said selected orientation prior to inserting said substrate into said process tool.

29. The method of claim 21, wherein said orientation of said substrate is determined based upon a location of a notch on said substrate.

30. The method of claim 21, wherein said orientation of said substrate is determined based upon a location of a flat on said substrate.

31. A method, comprising:

providing a plurality of semiconducting substrates to a processing tool; and positioning each of said substrates within said tool at a selected orientation such that the number of defective die formed on each of said substrates is minimized when a process operation is performed thereon in said process tool said selected orientation being based upon a determined defective die pattern of said process tool.

32. The method of claim 31, wherein said process tool is comprised of at least one of a deposition tool, an etch tool, an ion implantation tool, a photolithography tool, a resist removal tool and a cleaning tool.

33. The method of claim 31, wherein said defective die are determined based upon a defect analysis.

34. The method of claim 31, wherein said defective die are determined based upon results of at least one electrical performance test.

35. The method of claim 31, wherein said defective die are determined based upon measurement of a physical characteristic of at least one feature.

36. The method of claim 31, wherein said semiconducting substrate is comprised of silicon.

37. The method of claim 31, wherein positioning each of said substrates in said process tool comprises inserting each of said substrates in said process tool and rotating each of said substrates to said selected orientation.

38. The method of claim 31, wherein positioning said substrates in said process tool comprises positioning each of said substrates to said selected orientation prior to inserting each of said substrates into said process tool.

39. The method of claim 31, wherein said orientation of said substrates is determined based upon a location of a notch on said substrate.

40. The method of claim 31, wherein said orientation of said substrates is determined based upon a location of a flat on said substrate.

41. A method, comprising:
performing at least one processing operation in a process tool on a first plurality of semiconducting substrates wherein each of said first plurality of substrates is positioned at a different orientation within said process tool during said at least one processing operation;
identifying a number of defective die produced on each of said first plurality of substrates; and
performing said at least one processing operation on a second plurality of semiconducting substrates in said process tool wherein each of said second plurality of substrates is positioned at an orientation that is selected to minimize the number of defective die produced on each of said second plurality of substrates.

42. The method of claim 41, wherein said process tool is comprised of at least one of a deposition tool, an etch tool, an ion implantation tool, a photolithography tool, a resist removal tool and a cleaning tool.

43. The method of claim 41, wherein said defective die are determined based upon a defect analysis.

44. The method of claim 41, wherein said defective die are determined based upon results of at least one electrical performance test.

45. The method of claim 41, wherein said defective die are determined based upon measurement of a physical characteristic of at least one feature.

46. The method of claim 41, wherein said semiconducting substrate is comprised of silicon.

47. The method of claim 41, wherein positioning said second plurality of substrates in said process tool comprises inserting each of said second plurality of substrates in said process tool and rotating each of said substrates to said selected orientation.

48. The method of claim 41, wherein positioning said second plurality of substrates in said process tool comprises positioning said second plurality of substrates to said selected orientation prior to inserting said substrates into said process tool.

49. The method of claim 41, wherein said orientation of each of said second plurality of substrates is determined based upon a location of a notch on each of said second plurality of substrates.

50. The method of claim 41, wherein said orientation of each of said second plurality of substrates is determined, based upon a location of a flat on each of said second plurality of substrates.

* * * * *